(12) United States Patent
Yocom (10) Patent No.: US 6,380,776 B1
(45) Date of Patent: Apr. 30, 2002

(54) ELECTRICAL SIGNAL SYNCHRONIZATION

(75) Inventor: Robert L. Yocom, Loveland, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/934,287

(22) Filed: Aug. 21, 2001

(51) Int. Cl.[7] .................................................. H03L 7/00
(52) U.S. Cl. ..................... 327/163; 327/162; 327/155; 375/362
(58) Field of Search ................................. 327/154, 155, 327/162, 163; 331/16, 17, 18; 375/355, 362, 373, 375, 376

(56) References Cited

U.S. PATENT DOCUMENTS 4,808,884 A * 2/1989 Hull et al. .................. 375/120
5,574,756 A * 11/1996 Jeong ......................... 375/376
6,212,249 B1 * 4/2001 Shin ........................... 327/161

* cited by examiner

Primary Examiner—Terry D. Cunningham
Assistant Examiner—An T. Luu
(74) Attorney, Agent, or Firm—John R. Ley, L.L.C.

(57) ABSTRACT

Digital circuitry synchronizes clock signals in a digital circuit. A value of a reference clock is sampled at a plurality of points near a transition point of a generated clock. It is determined whether the reference clock transitioned from a first state to a second state before, after or within an acceptable range of a transition point of the generated clock. Upon determining that the reference clock transitioned before the transition point of the generated clock, one period of the generated clock is shortened. Upon determining that the reference clock transitioned after the transition point of the generated clock, one period of the generated clock is lengthened.

27 Claims, 3 Drawing Sheets

ELECTRICAL SIGNAL SYNCHRONIZATION

FIELD

The subject matter herein relates to synchronization of electrical signals, and more particularly, to synchronization of digital signals using a digital phase-locked loop.

BACKGROUND

It is often necessary to synchronize one electrical signal with another relative to the phase of the two signals. In a digital system having multiple digital subsystems connected or operating together, for example, multiple clocks may be used to operate different parts of the digital circuitry that must function cooperatively. For better cooperative functioning, the clocks are commonly synchronized using a digital phase-locked loop (DPLL), so that the components of the circuits operated by the clocks are "clocked" at the same time, or within a desired skew of each other.

Different phase-locked loop (PLL) schemes are used for different purposes in different situations. When a heretofore unencountered situation occurs, a new PLL or DPLL needs to be developed.

It is with respect to these and other background considerations that the subject matter herein has evolved.

SUMMARY

The subject matter herein discloses circuitry for synchronizing clock signals, such as a low-cost digital phase-locked loop (DPLL) for synchronizing clock signals in digital circuitry. The description of the DPLL in a hardware descriptive programming language (e.g. Verilog or VHDL) may be scalable and parameterizable, so that it may be quickly adapted for different applications.

The DPLL generally samples a "reference clock" immediately before, approximately at and immediately after an anticipated transition point of a "generated clock" to determine whether the reference clock transitions early, approximately on time (i.e. within an acceptable tolerance or range) or late relative to the transition point of the generated clock. In response to the sampling, the DPLL generally generates an "early" signal or a "late" signal or neither signal. The early and late signals indicate whether the period of the generated clock needs to be shortened or lengthened, respectively, generally by the amount of one period of an "input clock," from which the generated clock is generally generated. When the DPLL generates neither the early nor late signal, then the reference clock evidently transitioned within the acceptable tolerance of the transition point of the generated clock, so no adjustment needs to be made to the generated clock.

The reference clock is generally sampled during each period of the generated clock, which is generally almost the same as the period of the reference clock. In this manner, generally in every period of the reference clock, the DPLL determines whether to lengthen or shorten one period of the generated clock by one period of the input clock, or leave the generated clock unchanged. The generated clock may be generated from an intermediate "output" clock, which is generated from the input clock, so the one period of the generated clock may be adjusted (lengthened or shortened) by actually making the adjustment to the output clock.

The DPLL generally uses phase detector circuitry with a plurality of "registers" to effectively "register," or "latch," the reference clock immediately before, approximately at and immediately after the approximate point at which a transition edge occurs in the generated signal. The point at which the edge occurs in the generated signal is the point at which an edge "should" occur in the reference signal, when already synchronized. For example, one of the registers generally registers the state of the reference clock at a point shortly before the point at which the reference clock would transition if already synchronized. Another register generally registers the state of the reference clock at a point almost at the anticipated transition point. A third register generally registers the state of the reference clock at a point shortly after the transition point. If the transition point is at a positive edge (a low-to-high transition) of the reference clock, and all the registered states are "low," then it is evident that the low-to-high transition of the reference signal occurred late with respect to the transition of the generated clock, so the "late" signal is asserted. On the other hand, if all the registered states are "high," then it is evident that the low-to-high transition of the reference clock occurred early, so the "early" signal is asserted. If, however, one or two of the registered states are low and the rest high, then the transition occurred within the acceptable tolerance, so neither the early nor the late signal is asserted.

The DPLL may synchronize the phases of multiple signals, each having a different period. For example, in one embodiment, the input clock has a period significantly shorter than that of the output clock and the reference clock, and the output clock has a period significantly shorter than that of the reference clock. Additionally, the period of the reference clock may be an integer multiple of the period of the output clock, which is an integer multiple of the period of the input clock. Therefore, since the period of the output clock is significantly smaller than that of the reference clock, the sampling points of the reference clock are relatively close to the transition point of the reference clock (and therefore to the transition point of the generated clock when synchronized) compared to the overall period of the reference clock. Additionally, since one of the periods of the output clock (and of the generated clock) is shortened or lengthened, when needed, by one period of the input clock, the change to the period of the output clock is generally relatively small compared to the overall period of the output clock and even smaller compared to the period of the reference clock. The change to the period of the output clock (i.e. one period of the input clock) is generally an amount less than the acceptable tolerance, so that the change to the period of the output clock can bring the transition point of the output clock (and of the generated clock) within the acceptable tolerance of the transition point of the reference clock without overshooting it.

Additionally, various parameters of the DPLL, as set forth in the code in the hardware descriptive programming language (e.g. Verilog or VHDL), can be changed to adapt the DPLL for a variety of applications, so that the DPLL operates with almost any given frequencies for the input, output, generated and reference clocks, though generally retaining the above-stated relationships between the clocks. In various applications, the parameters are set in a module file, written in the hardware descriptive programming language (such as Verilog or VHDL), that defines the digital circuit. For example, since the clocks are digital, the input clock can be "divided" by any appropriate means, such as by a digital counter, to generate the output clock. Changing the count of the counter causes a related change to the output clock (i.e. "scaling" the output clock). The count of the counter is determined by a value (i.e. a parameter) set in the code for the module file written in the hardware descriptive programming language for the digital circuit. Likewise, other counters and other components generally have values, or parameters, set in the code for the digital circuit for determining the time between registered states of the reference clock, or the amount by which the output clock is lengthened or shortened, among other variable features. In this manner, the DPLL is parameterizable, and "scalable," for a variety of applications.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

DETAILED DESCRIPTION

Figure 1:
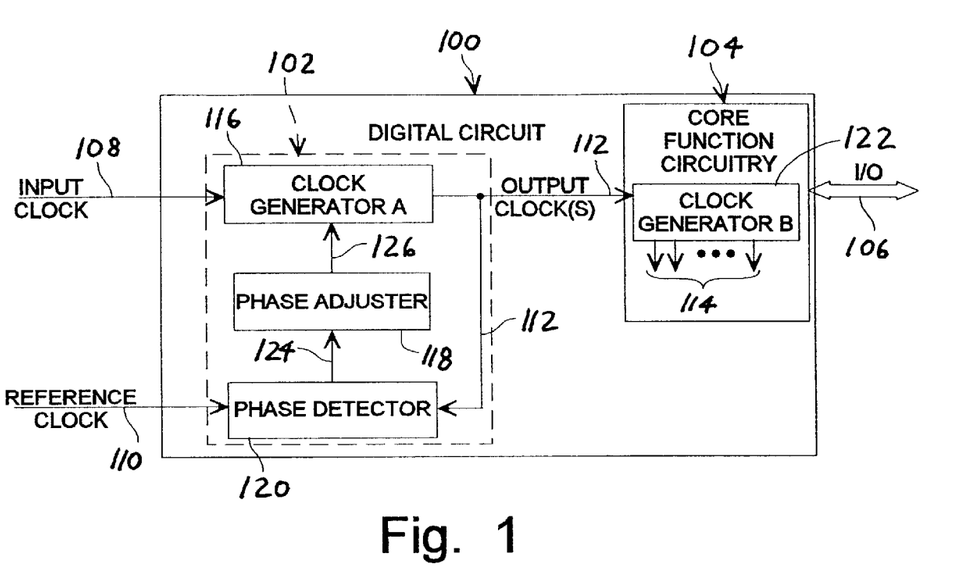
FIG. 1 is a block diagram of a digital circuit having a digital signal synchronization feature.

A digital circuit 100, according to the subject matter disclosed herein, generally has some type of clock generation and synchronization circuitry 102 and some type of core function circuitry 104, as shown in FIG. 1. The core function circuitry 104 generally performs the primary function of the digital circuit 100, such as the function of an audio codec, a microprocessor, a graphics chip or other digital circuit. To perform the primary function, the core function circuitry 104 receives input from and sends output to (via I/O signals 106) other circuits or computer chips (not shown). The clock generation and synchronization circuitry 102 receives an input clock 108 and a reference clock 110 and generates one or more output clock 112. The output clock 112 is generally an "internal clock" within the digital circuit 100 used for timing and controlling of components of the digital circuit 100. The input clock 108 is generally an externally generated clock signal used to generate the output clock 112. The reference clock 110 is also generally an external clock signal and is generally used to control some of the other circuits or computer chips (not shown) with which the digital circuit 100 communicates via the I/O signals 106. It is the reference clock 110 to which the output clock 112 and any other internal clocks (e.g. 114) must be synchronized for proper cooperative functioning of the digital circuit 100 with the other circuits or computer chips. Therefore, the clock generation and synchronization circuitry 102 generates the output clock 112 from the input clock 108 and synchronizes the output clock 112 to the reference clock 110.

The clock generation and synchronization circuitry 102 includes a clock generator 116 (clock generator A), a phase adjuster 118 and a phase detector 120. The core function circuitry 104 includes another clock generator 122 (clock generator B). The clock generator 116 receives the input clock 108 and produces the output clock 112 therefrom, such as by dividing the frequency of the input clock 108 down to a desired frequency for the output clock 112 for controlling the core function circuitry 104. The clock generator 116 may thus use any appropriate clock divider technique or device (such as a counter, not shown in FIG. 1) to generate the output clock 112. The clock generator 122 receives the output clock 112 and generates therefrom the other internal clocks 114 needed for the proper operation of the core function circuitry 104.

The phase detector 120 receives the output clock 112 and the reference clock 110 and determines whether transition edges of the clocks 110 and 112 occur at about the same time, i.e. the clocks 110 and 112 are in phase with each other. Alternatively, a particular one or more of the other internal clocks 114 is the clock that needs to be synchronized with the reference clock 110, so the phase detector 120 generates an approximation of the particular internal clock 114, with which the phase detector 120 determines whether the transition edge of the reference clock 110 occurs at about the proper time. The phase detector 120 generates a transition signal 124 indicative of whether the transition edge of the reference clock 110 occurred at about the proper time, too early or too late.

The phase adjuster 118 receives the transition signal 124 and generates an adjust signal 126. The clock generator 116 receives the input clock 108 and the adjust signal 126 and generates the output clock 112 from the input clock 108 with an adjustment, if needed, based on the adjust signal 126. For example, if the transition signal 124 indicates that the transition point of the reference clock 110 occurred too early, then the phase adjuster 118 sends the adjust signal 126 to cause the clock generator 116 to slightly shorten the period of the output clock 112. On the other hand, if the transition signal 124 indicates that the transition point of the reference clock 110 occurred too late, then the phase adjuster 118 sends the adjust signal 126 to cause the clock generator 116 to slightly lengthen the period of the output clock 112. In this manner, the transition point of the output clock 112 (or of the other internal clock(s) 114) is adjusted toward the transition point of the reference clock 110. The adjustment is repeated incrementally, generally once in each period of the reference clock 110, until the transition points are within an acceptable tolerance or range of each other. The amount of the adjustment is generally one period of the input clock, which should be less than the range of the acceptable tolerance, so that the adjustments will not overshoot the acceptable tolerance.

Figure 2:
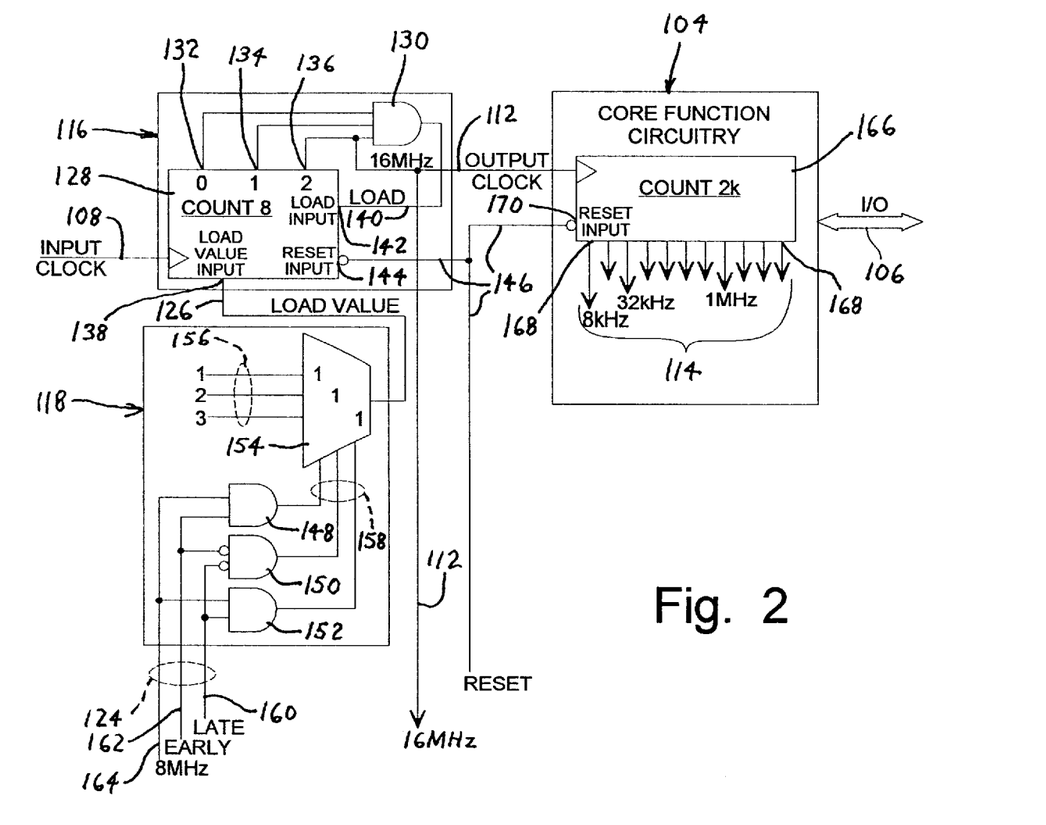
FIG. 2 is a block diagram of a phase adjuster and clock generator circuitry incorporated within the digital circuit shown in FIG. 1.

Example circuitry for the phase adjuster 118 and the clock generators 116 and 122 are shown in FIG. 2. Any appropriate circuitry may be used to generate the output clock 112 at a desired frequency given the frequency of the input clock 108, but in this example, the clock generator 116 includes a counter 128 (such as an 8-counter) and an AND gate 130 (such as a three-bit AND gate). The counter 128 receives the input clock 108 and counts the periods, or cycles, of the input clock 108. The counter 128 has three output bits 132, 134 and 136 for producing the output count from zero to seven, but also includes a load value input 138 for loading a starting count value indicated by a load value supplied in the adjust signal 126 from the phase adjuster 118. Thus, the counter 128 starts counting at the load value, rather than always starting at zero. In this manner, the total count of the counter 128 can be adjusted to a greater or lesser value.

The most significant bit 136 of the counter 128 produces the output clock 112, which is a division of the input clock 108 by the total count of the counter 128. The output clock 112 is then supplied to the core function circuitry 104 and to the phase detector 120 (FIG. 1).

Whatever load value is "normally" supplied to the counter 128 from the phase adjuster 118 through the adjust signal 126 determines the total count by which the input clock 108 is divided to generate the output clock 112. For example, if the input clock 108 is a 98MHz clock, the counter 128 is an 8-counter and the normal load value is two, then the total count is six (8−2=6), and the output clock 112 is 16 MHz (98/6=16). When it is necessary to shorten the period of the output clock 112 to bring the transition point of the output clock 112 (or of the other internal clock(s) 114) closer to the transition point of the reference clock 110 (FIG. 1), the load value supplied by the phase adjuster 118 via the adjust signal 126 may be three, instead of two. On the other hand, when it is necessary to lengthen the period of the output clock 112 to bring the transition point of the output clock 112 (or of the other internal clock(s) 114) closer to the transition point of the reference clock 110 (FIG. 1), the load value supplied by the phase adjuster 118 via the adjust signal 126 may be one. In this manner, one period of the output clock 112 (and consequently the other internal clock(s) 114) can be shortened or lengthened by one period of the input clock 108. Alternatively, the clock generation and synchronization circuitry 102 (FIG. 1) may support loading an even greater or lesser value (such as four or zero) into the counter 128 in order to shorten or lengthen, respectively, the period of the output clock 112 by an even greater number of input clock periods in order to bring the transition point of the output clock 112 (or of the other internal clock(s) 114) closer to the transition point of the reference clock 110 more rapidly.

The AND gate 130 logically ANDs together the output bits 132–136 of the counter 128 and supplies the result (a load signal 140) to a load input 142 of the counter 128. When the load signal 140 is "active" (at the end of the total count of the counter 128), it causes the counter 128 to load the load value at the load value input 138 at the positive edge clock of the cycle following the terminal count (1:1:1) of the output bits 132, 134 and 136.

The counter 128 also generally has a reset input 144 at which it receives a reset signal 146. Upon receipt of the reset signal 146, the counter 128 resets the output bits 132–136, generally to all zeroes.

Any appropriate circuitry that can determine the phase relation in the transition signal 124 and supply a counter load value may be used to generate the adjust signal 126, but in this example, the phase adjuster 118 includes a set of three AND gates 148, 150 and 152 and a multiplexor (MUX) 154. The output of the MUX 154 supplies the load value via the adjust signal 126 to the clock generator 116. The MUX 154 has three inputs that receive the three (or more if supported) possible load values 156: one, two or three. The AND gates 148–152 supply selection signals 158 to the MUX 154 for selecting one of the possible load values 156 to be supplied via the adjust signal 126.

The AND gates 148–152 generate the selection signals 158 from the transition signal 124 supplied from the phase detector 120 (FIG. 1). The transition signal 124 is generally composed of a "late" signal 160, an "early" signal 162 and an optional 8 MHz signal 164 (described below). The late signal 160 is supplied by the phase detector 120 to indicate that the transition point of the reference clock 110 (FIG. 1) arrived late relative to, or after, the transition point of the output clock 112 (or of the other internal clock(s) 114). The early signal 162 is supplied by the phase detector 120 to indicate that the transition point of the reference clock 110 arrived early relative to, or before, the transition point of the output clock 112 (or of the other internal clock(s) 114). If neither the late signal 160 nor the early signal 162 is supplied by the phase detector 120, then the transition point of the reference clock 110 evidently arrived within the acceptable tolerance of the transition point of the output clock 112 (or of the other internal clock(s) 114). In other words, the clocks 110, 112 and 114 are synchronized. The 8 MHz signal 164 effectively "blocks out" the sampling window for determining whether the early signal 162 or the late signal 160 is being received so as to ensure that the counter 128 won't be loaded twice, e.g. when the 8 MHz signal 164 is high and then again when it is low.

The late signal 160 and early signal 162 are inverted at the inputs to the AND gate 150. Therefore, if neither the late signal 160 nor the early signal 162 is supplied by the phase detector 120 (FIG. 1), then the AND gate 150 supplies the selection signal 158 that selects the "2" possible load value 156. This possible load value 156, in this example, makes the total count for the counter 128 six, which is the "normal" total count that results in the output clock 112 not having to be adjusted.

The late signal 160 and the 8 MHz signal 164 are supplied to the inputs of the AND gate 152. Therefore, if the late signal 160 is supplied by the phase detector 120, then the AND gate 152 supplies the selection signal 158 that selects the "3" possible load value 156 on a "high" portion of the 8 MHz signal 164. This possible load value 156, in this example, makes the total count for the counter 128 five, which is the total count that results in shortening the current period of the output clock 112.

The early signal 162 and the 8 MHz signal 164 are supplied to the inputs of the AND gate 148. Therefore, if the early signal 162 is supplied by the phase detector 120, then the AND gate 148 supplies the selection signal 158 that selects the "1" possible load value 156 on a "high" portion of the 8 MHz signal 164. This possible load value 156, in this example, makes the total count for the counter 128 seven, which is the total count that results in lengthening the current period of the output clock 112.

Any appropriate circuitry may be used to generate the other internal clock(s) 114, but in this example, the core function circuitry 104 includes another counter 166 (such as a 2k-counter), which receives the output clock 112. Thus, the counter 166 has eleven output bits 168 for counting approximately 2048 (i.e. "2k") of the periods of the output clock 112. Each output bit 168 produces a different division of the output clock 112. For example, the fourth least significant output bit 168 produces approximately a 1 MHz clock, the third most significant output bit produces a 32 kHz clock and the most significant output bit produces an 8 kHz clock. Each of these other internal clocks 114 may control a different portion (not shown) of the core function circuitry 104, depending on the speed requirements of each portion.

The core function circuitry 104 also generally has a reset input 170 for receiving the reset signal 146. Thus, upon assertion of the reset signal 146, both counters 128 and 166 are generally reset to all zeroes and start counting at about the same time.

Figure 3:
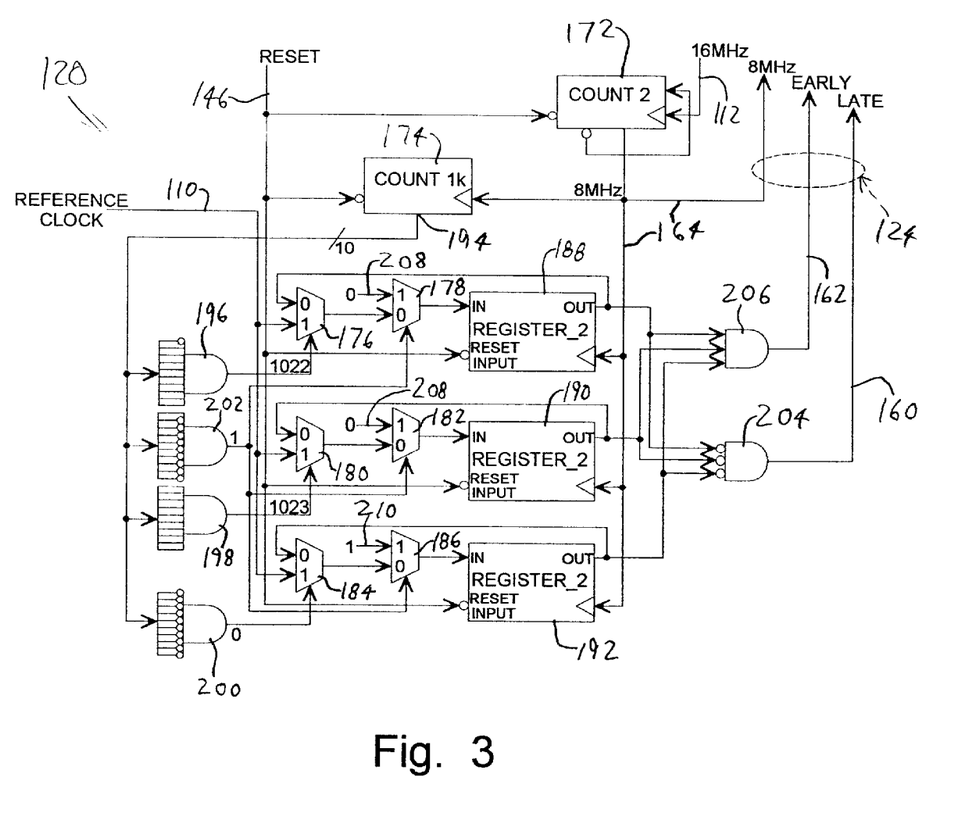
FIG. 3 is a block diagram of a phase detector circuitry incorporated within the digital circuit shown in FIG. 1.

Example circuitry for the phase detector 120 is shown in FIG. 3. Any appropriate circuitry may be used to generate the late signal 160, the early signal 162 and the optional 8 MHz signal 164 of the transition signal 124. In this example, however, the phase detector 120 includes, among other components shown, two counters 172 and 174, six MUX's 176–186 and three registers 188–192 (register_2 register_1 and register_0). The MUX's 176–186 are arranged in three sets of two-stage MUX's in combination with the three registers 188–192.

The counter 172 is generally a 2-counter (in this example) that receives the output clock 112 and counts each period of the output clock 112 to divide the 16 MHz frequency (in this example) of the output clock 112 into the 8 MHz signal 164 (see also FIG. 2). The other counter 174 is generally a 1k-counter (in this example) having ten output bits 194. Thus, the counter 174 counts approximately 1024 periods, or cycles, of the 8 MHz signal 164 during each cycle of an effective 8 kHz counting cycle (8 MHz/1k=8 kHz).

Each combination of two-stage MUX's (176/178, 180/182, or 184/186) plus register (188, 190 or 192, respectively) registers, or "latches," the state (logic 1 or 0) of the reference clock 110 on a different period of the 8 MHz signal 164 during the effective 8 kHz counting cycle. The state of the reference clock 110 is thus registered at three periods of the 8 MHz signal 164 once per cycle of the effective 8 kHz counting cycle. Furthermore, the transition point (e.g. logic 1 to 0) of the reference clock 110 should occur in the second or third of these three periods when the clocks 110, 112 and 114 are properly synchronized.

In this example, the three periods of the 8 MHz signal 164 at which the state of the reference clock 110 is registered are generally the last two 8 MHz periods in one cycle of the effective 8 kHz counting cycle and the first 8 MHz period in the next cycle of the effective 8 kHz counting cycle. In other words, when the counter 174 is at 1022 (as determined by an AND gate 196), the first MUX's 176 and 178 and the register 188 register the value of the state (logical 1 or 0) of the reference clock 110. Likewise, when the counter 174 is at 1023 (as determined by an AND gate 198), the second MUX's 180 and 182 and the register 190 register the value of the state of the reference clock 110. Additionally, when the counter 174 is at 0 (as determined by an AND gate 200), the third MUX's 184 and 186 and the register 192 register the value of the state of the reference clock 110.

Each set of the two-stage MUX's 176/178, 180/182 and 184/186 in combination with the registers 188, 190 and 192, respectively, function generally the same, except on a different count of the counter 174. For example, the first-stage MUX 176 in the first set receives as its inputs the reference clock 110 and the output of the register 188 and receives as its selection input the output of the AND gate 196. The AND gate 196 supplies a logical zero to the selection input of the MUX 176 as long as the count of the counter 174 is not 1022 and supplies a logical one to the selection input of the MUX 176 when the count of the counter 174 is 1022. The first-stage MUX 176, thus, passes whatever logical value is produced by the register 188 when the count of the counter 174 is not 1022, but passes the logical value of the state of the reference clock 110 when the count of the counter 174 is 1022. Similarly, the second-stage MUX 178 receives as its inputs a logical zero value 208 and the output of the first-stage MUX 176 and receives as its selection input the output of an AND gate 202. The second-stage MUX 178, thus, passes whatever logical value is passed by the first-stage MUX 176 as long as the count of the counter 174 is not 1, as determined by the AND gate 202, but passes the logical zero value 208 when the count of the counter 174 is 1. The register 188 is clocked by the 8 MHz signal 164, receives the output of the second-stage MUX 178 at its input, registers its input value in each period of the 8MHz signal 164 and produces its registered value at its output.

The second and third sets of the two-stage MUX's 180/182 and 184/186 in combination with the registers 190 and 192, respectively, function generally the same as described with reference to MUX's 176 and 178 and register 188. However, the first-stage MUX 180 in the second set passes the logical value of the state of the reference clock 110 when the count of the counter 174 is 1023, as determined by the AND gate 198, and the first-stage MUX 184 in the third set passes the logical value of the state of the reference clock 110 when the count of the counter 174 is 0, as determined by the AND gate 200. Additionally, the second-stage MUX 186 in the third set receives as one of its inputs a logical one value 210, instead of the logical zero value 208, which is passed by the MUX 186 when the count of the counter 174 is 1.

In operation, when the count of the counter 174 reaches 1022, the AND gate 196 produces a logical one, which causes the first-stage MUX 176 to pass through the state of the reference clock 110, whether high or low. At this point, the count of the counter 174 is not 1, so the AND gate 202 supplies a logical zero to the second-stage MUX 178. Thus, the second-stage MUX 178 passes the output of the first-stage MUX 176 (which is the state of the reference clock 110) to the register 188. The register 188, thus, registers the state of the reference clock 110 received from the output of the second-stage MUX 178. On the next period of the 8 MHz signal 164, the count of the counter 174 is no longer 1022, so the AND gate 196 supplies a logical zero to the first-stage MUX 176, which causes the first-stage MUX 176 to pass through the output of the register 188, which is now the previously registered state of the reference clock 110. At this point, the count of the counter 174 is still not 1, so the second-stage MUX 178 continues to pass the output of the first-stage MUX 176 to the register 188. Thus, the register 188 continues to register the previously registered state of the reference clock 110. The other sets of MUX's 180/182 and 184/186 and registers 190 and 192, respectively, perform the same operation, except that the second set (MUX's 180 and 182 and register 190) starts the operation when the count of the counter 174 is 1023 and the third set (MUX's 184 and 186 and register 192) starts when the count of the counter 174 is 0. Therefore, by the time that the count of the counter 174 changes to 1 (as determined by the AND gate 202), the registers 188–192 are producing the state of the reference clock 110 at the three points. In this manner, the registered values in the registers 188–192 (register_2 register_1, register_0) will be 111, 011, 001 or 000 by the time that the counter 174 is at 1. In this manner, the phase detector 120 samples the reference clock $110\ ^1/_{1024}$th of an 8 kHz cycle before, during and after a positive edge 8 kHz transition.

After the count of the counter 174 reaches 1, as determined by the AND gate 202, the logical zero value 208 supplied to the second-stage MUX's 178 and 182 and the logical one value 210 supplied to the second-stage MUX 186 cause the registers 188–192 to register a value 001, until the next time that the state of the reference clock 110 is registered. Therefore, for about one period of the 8 MHz signal 164, the registers 188–192 produce the state of the reference clock 110 at the three points.

If the transition point (1 to 0) of the reference clock 110 occurs early, then the values of the registers 188–192 will be 111. On the other hand, if the transition point of the reference clock 110 occurs late, then the values of the registers 188–192 will be 000. However, if the transition point of the reference clock 110 occurs approximately within the last period of the 8 MHz signal 164 in one 8 kHz counting cycle or within the first period of the 8 MHz signal 164 in the next 8 kHz counting cycle, then the values of the registers 188–192 will be 011 or 001, respectively. The values of 011 and 001 indicate that the transition point of the reference clock 110 occurred within an acceptable tolerance and that the clocks 110, 112 and 114 are approximately synchronized.

Given the values of the registers 188–192, the phase detector 120 asserts the late signal 160, the early signal 162 or neither. An AND gate 204 receives the values (inverted) of the registers 188–192 and produces the late signal 160 when the values of the registers 188–192 are 000. Likewise, an AND gate 206 receives the values of the registers 188–192 and produces the early signal 162 when the values of the registers 188–192 are 111. On the other hand, the AND gates 204 and 206 produce neither the late signal 160 nor the early signal 162 when the values of the registers 188–192 are 011 or 001. The late signal 160 and the early signal 162 (and the 8 MHz signal 164, if needed) are then sent to the phase adjuster 118 (FIGS. 1 and 2) and used as described above to lengthen or shorten one period of the output clock 112 by one period of the input clock 108 (FIGS. 1 and 2) to bring the clocks 110, 112 and 114 into synchronization.

The above process for registering the state of the reference clock 110 and asserting the late signal 160 or the early signal 162 (or neither) is repeated once for each cycle of the effective 8kHz counting cycle. Therefore, if the transition point of the reference clock 110 occurs at a time that is more than one period of the input clock 108 (FIGS. 1 and 2) late or early, then the clock generation and synchronization circuitry 102 (FIG. 1) will take more than one cycle of the effective 8 kHz counting cycle to bring the clocks 110, 112 and 114 into approximate synchronization.

In this example, the counters 172 and 174 and the registers 188–192 receive the reset signal 146. Therefore, upon assertion of the reset signal 146, the counters 172 and 174 and the registers 188–192 and the counters 128 and 166 (FIG. 2) are reset to zero. The counters 128, 166, 172 and 174 begin counting, and the registers 188–192 are quickly loaded with the value 001 (about in the second period of the 8 MHz signal 164), due to the logical zero values 208 and the logical one value 210. If the reference clock 110 is also reset at about the same time that the reset signal 146 is asserted, then it is very likely that the output clock 112 and the other internal clocks 114 (FIGS. 1 and 2) will begin at about the same time that the reference clock 110 starts, so the clocks 110, 112 and 114 may already be fairly close to being synchronized. Therefore, it will not take very many cycles of the effective 8 kHz counting cycle to bring the clocks 110, 112 and 114 fully into synchronization. In this case, the clock generation and synchronization circuitry 102 (FIG. 1) is appropriate for use in a wide variety of applications.

In this example, it may be the 8 kHz clock (FIG. 2) of the other internal clocks 114 (FIG. 2) that operates portions of the core function circuitry 104 in coordination with any other circuits or computer chips (not shown), that are operated by the reference clock 110, with which the digital circuit 100 communicates. Therefore, it is the 8 kHz clock (of the other internal clocks 114) and the reference clock 110 (also 8 kHz) that must be synchronized together. However, since the effective 8 kHz counting cycle and the 8 kHz clock (114) are both generated from the output clock 112, they are already synchronized with each other, though possibly with a constant skew due to timing variations in their respective signal paths. In this manner, the effective 8 kHz counting cycle acts as an approximation of the 8 kHz clock (114). Therefore, the synchronization of the effective 8 kHz counting cycle with the reference clock 110 effectively synchronizes the 8 kHz clock (114) with the reference clock 110, though possibly with a constant skew, which can be easily accounted for by introducing appropriate delays in the 8 kHz clock (114).

The clock generation and synchronization circuitry 102 (FIG. 1) may incorporate any appropriate components that can generate the clocks 112 and 114 (FIGS. 1 and 2) and synchronize the clocks 112 and 114 with the reference clock 110 (FIGS. 1 and 3). However, the particular embodiment shown has the advantage of allowing flexibility and ease of modification of various parameters, so that the general clock generation and synchronization circuitry 102 can be adapted for different specific applications. In particular (but not limiting), the parameters for the input clock 108 (FIGS. 1 and 2), the counters 128, 166 (FIG. 2), 172 and 174 (FIG. 3), the possible load values 156 (FIG. 2) and the points at which the AND gates 196–200 (FIG. 3) cause the registering of the state of the reference clock 110 may be different than those shown and described herein. As such circuitry is typically described in a computer file written in a hardware programming language, such as Verilog or VHDL, changing the various parameters is often a simple matter of changing numbers in the computer file.

For example, a different frequency of the input clock 108 may result in a different frequency of the output clock 112 and of the other internal clocks 114 and a different amount by which the output clock 112 is adjusted. Additionally, the frequency divisions of the input clock 108 and the output clock 112 by the counters 128 and 166, respectively, can be specified with different count values to result in different frequencies for the output clock 112 and the other internal clocks 114. Likewise, the counters 172 and 174 can be specified with different count values to result in a smaller or larger time period between which the state of the reference clock 110 is registered to give a greater or lesser "resolution" of the transition point of the reference clock 110, i.e. a smaller or larger acceptable tolerance in the synchronization.

Also, different possible load values 156 can result in either a different division of the input clock 108 for generating the output clock 112 or can result in a different amount by which the output clock is adjusted. For instance, if all three of the possible load values 156 were increased by one, then the counter 128 would divide the input clock 108 by five (in this example) to generate the output clock 112. On the other hand, if the "1" possible load value 156 were decreased to "0," the "3" possible load value 156 were increased to "4" and the "2" possible load value 156 remained the same, then the counter 128 would still divide the input clock 108 by 6, but each adjustment to the output clock 112 would be twice as large as it was previously.

Additionally, different count values at which the AND gates 196, 198 and 200 cause the MUX's 176, 180 and 184, respectively, to pass through the state of the reference clock 110 can result in a different acceptable tolerance in the synchronization or a predetermined built-in skew in the synchronization. For instance, if the specified count values determined by the AND gates 196–200 were two counts apart, instead of one count apart as shown in the example, then the acceptable tolerance would be doubled. Additionally, if the specified count values were somewhere between the start and end counts (0 and 1023 in the example shown) of the counter 174, instead of at the beginning and end (0, 1022 and 1023), then the clock generation and synchronization circuitry 102 could cause a built-in skew between the reference clock 110 and the output clock 112 (and the other internal clocks 114), which can be desirable in some applications.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A method of synchronizing clock signals in a digital circuit, wherein the digital circuit receives an input clock and a reference clock, generates a generated clock from the input clock and synchronizes the generated clock to the reference clock, comprising:

sampling a value of the reference clock at a plurality of points near a transition point of the generated clock;

determining from the sampling whether the reference clock transitioned from a first state to a second state before, after or within an acceptable range of the transition point of the generated clock;

upon determining that the reference clock transitioned before the transition point of the generated clock, shortening one period of the generated clock;

upon determining that the reference clock transitioned after the transition point of the generated clock, lengthening one period of the generated clock; and upon determining that the reference clock transitioned within the acceptable range of the transition point of the generated clock, maintaining the period of the generated clock.

2. A method as defined in claim 1 further comprising:

generating a count clock from the input clock, the count clock having a period shorter than a period of the generated clock; and for each period of the generated clock, if the transition of the reference clock occurs more than one period of the count clock from the transition point of the generated clock, shifting the transition point of the generated clock by one period of the input clock.

3. A method as defined in claim 1 further comprising:

determining that the reference clock transitioned after the transition point of the generated clock when the sampled value of the reference clock at all of the plurality of points comprises the first state;

determining that the reference clock transitioned before the transition point of the generated clock when the sampled value of the reference clock at all of the plurality of points comprises the second state; and determining that the reference clock transitioned within the acceptable range of the transition point of the generated clock when the sampled value of the reference clock at some of the plurality of points comprises the first state and the sampled value of the reference clock at the remainder of the plurality of points comprises the second state.

4. A method as defined in claim 1 further comprising:

upon determining that the reference clock transitioned before the transition point of the generated clock, shortening the one period of the generated clock by one period of the input clock; and upon determining that the reference clock transitioned after the transition point of the generated clock, lengthening the one period of the generated clock by one period of the input clock.

5. A method as defined in claim 1, wherein the reference clock and the generated clock have periods that are about the same length, further comprising:

generating a count clock from the input clock, the count clock having a period shorter than the period of the generated clock;

counting a predetermined number of periods of the count clock, the predetermined number of periods of the count clock together being about the length of the period of the generated clock; and sampling the reference clock at a plurality of successive periods of the count clock.

6. A method as defined in claim 5 further comprising:

sampling the reference clock each period of the generated clock.

7. A method as defined in claim 5 further comprising:

generating an output clock from the input clock, the output clock having a period greater than a period of the input clock;

generating the generated clock from the output clock, the period of the generated clock being greater than the period of the output clock; and generating the count clock from the output clock.

8. A method as defined in claim 7 further comprising:

upon determining that the reference clock transitioned before the transition point of the generated clock, shortening one period of the generated clock by shortening one period of the output clock from which the generated clock is generated; and upon determining that the reference clock transitioned after the transition point of the generated clock lengthening one period of the generated clock by lengthening one period of the output clock from which the generated clock is generated.

9. A method as defined in claim 5 further comprising:

sampling the reference clock at three successive periods of the count clock.

10. A digital circuit receiving an input clock and a reference clock and producing a generated clock that is synchronized with the reference clock, comprising:

a clock generator that generates an output clock from the input clock, the output clock being related to the generated clock and having a period;

a phase detector receiving the reference clock and connected to the clock generator to receive the output clock, the phase detector sampling the reference clock near a transition point of the generated clock to determine whether the reference clock transitioned from a first state to a second state before, after or within an acceptable range of the transition point of the generated clock, the phase detector determining the transition point of the generated clock from the received output clock, the phase detector producing a transition signal indicating whether the reference clock transitioned before, after or within the acceptable range of the transition point of the generated clock; and a phase adjuster connected to the phase detector to receive the transition signal produced therefrom and connected to the clock generator to send an adjust signal thereto causing the clock generator to maintain the period of the output clock, to shorten the period or to lengthen the period.

11. A digital circuit as defined in claim 10 wherein:

the phase detector generates a count clock having a period shorter than a period of the generated clock; and for each period of the generated clock, if the transition of the reference clock occurs more than one period of the count clock from the transition point of the generated clock, the phase detector sends the adjust signal to the clock generator to cause the clock generator to shift the transition point of the generated clock by one period of the input clock.

12. A digital circuit as defined in claim 10 wherein:

the phase detector samples a value of the reference clock at a plurality of points near the transition point of the generated clock;

the phase detector produces the transition signal to indicate that the reference clock transitioned after the transition point of the generated clock when the sampled value of the reference clock at all of the plurality of points comprises the first state;

the phase detector produces the transition signal to indicate that the reference clock transitioned before the transition point of the generated clock when the sampled value of the reference clock at all of the plurality of points comprises the second state; and the phase detector produces the transition signal to indicate that the reference clock transitioned within the acceptable range of the transition point of the generated clock when the sampled value of the reference clock at some of the plurality of points comprises the first state and the sampled value of the reference clock at the remainder of the plurality of points comprises the second state.

13. A digital circuit as defined in claim 10 wherein:

the input clock has a period shorter than the period of the output clock;

upon receiving the transition signal from the phase detector indicating that the reference clock transitioned before the transition point of the generated clock, the phase adjuster sends the adjust signal to cause the clock generator to shorten the period of the output clock by one period of the input clock; and upon receiving the transition signal from the phase detector indicating that the reference clock transitioned after the transition point of the generated clock, the phase adjuster sends the adjust signal to cause the clock generator to lengthen the period of the output clock by one period of the input clock.

14. A digital circuit as defined in claim 10 wherein:

the reference clock and the generated clock have periods that are about the same length;

the phase detector generates a count clock from the output clock;

the count clock has a period shorter than the period of the generated clock;

the phase detector counts a predetermined number of periods of the count clock;

the predetermined number of periods of the count clock together are about the length of the period of the generated clock; and the phase detector samples the reference clock at a plurality of successive periods of the count clock.

15. A digital circuit as defined in claim 14 wherein the phase detector samples the reference clock each period of the generated clock.

16. A digital circuit as defined in claim 14, wherein the clock generator aforesaid is a first clock generator, further comprising:

a second clock generator connected to the first clock generator to receive the output clock, the second clock generator generating the generated clock from the output clock;

and wherein:

the input clock has a period;

the period of the output clock is greater than the period of the input clock; and the period of the generated clock is greater than the period of the output clock.

17. A digital circuit as defined in claim 16 wherein:

upon receiving the transition signal from the phase detector indicating that the reference clock transitioned before the transition point of the generated clock, the phase adjuster sends the adjust signal to cause the clock generator to shorten one period of the output clock;

the shortened period of the output clock causes the second clock generator to shorten one period of the generated clock;

upon receiving the transition signal from the phase detector indicating that the reference clock transitioned after the transition point of the generated clock, the phase adjuster sends the adjust signal to cause the clock generator to lengthen one period of the output clock; and the lengthened period of the output clock causes the second clock generator to lengthen one period of the generated clock.

18. A digital circuit as defined in claim 14 wherein the phase detector samples the reference clock at three successive periods of the count clock.

19. A digital circuit receiving an input clock and a reference clock and producing a generated clock that is synchronized with the reference clock, comprising:

a means for sampling a value of the reference clock at a plurality of points near a transition point of the generated clock;

a means for determining from the sampled values whether the reference clock transitioned from a first state to a second state before, after or within an acceptable range of the transition point of the generated clock; and a means for shortening one period of the generated clock upon a determination that the reference clock transitioned before the transition point of the generated clock and for lengthening the one period of the generated clock upon a determination that the reference clock transitioned after the transition point of the generated clock, the means for shortening and lengthening not changing the period of the generated clock upon a determination that the reference clock transitioned within the acceptable range of the transition point of the generated clock.

20. A digital circuit as defined in claim 19 further comprising:

a means for generating a count clock from the input clock, the count clock having a period shorter than a period of the generated clock;

and wherein the shortening and lengthening means shifts the transition point of the generated clock by one period of the input clock for each period of the generated clock if the transition of the reference clock occurs more than one period of the count clock from the acceptable range of the transition point of the generated clock.

21. A digital circuit as defined in claim 19 wherein:

the determining means determines that the reference clock transitioned after the transition point of the generated clock when the sampled value of the reference clock at all of the plurality of points comprises the first state;

the determining means determines that the reference clock transitioned before the transition point of the generated clock when the sampled value of the reference clock at all of the plurality of points comprises the second state; and the determining means determines that the reference clock transitioned within the acceptable range of the transition point of the generated clock when the sampled value of the reference clock at some of the plurality of points comprises the first state and the sampled value of the reference clock at the remainder of the plurality of points comprises the second state.

22. A digital circuit as defined in claim 19 wherein:

upon determining that the reference clock transitioned before the transition point of the generated clock, the shortening and lengthening means shortens the one period of the generated clock by one period of the input clock; and upon determining that the reference clock transitioned after the transition point of the generated clock, the shortening and lengthening means lengthens the one period of the generated clock by one period of the input clock.

23. A digital circuit as defined in claim 19, wherein the reference clock and the generated clock have periods that are about the same length, further comprising:

a means for generating a count clock from the input clock, the count clock having a period shorter than the period of the generated clock; and a means for counting a predetermined number of periods of the count clock, the predetermined number of periods of the count clock together being about the length of the period of the generated clock;

and wherein the sampling means samples the reference clock at a plurality of successive periods of the count clock.

24. A digital circuit as defined in claim 23 wherein:

the sampling means samples the reference clock each period of the generated clock.

25. A digital circuit as defined in claim 23 further comprising:

a means for generating an output clock from the input clock, the output clock having a period greater than a period of the input clock; and a means for generating the generated clock from the output clock, the period of the generated clock being greater than the period of the output clock;

and wherein the means for generating the count clock indirectly generates the count clock from the input clock by generating the count clock from the output clock.

26. A digital circuit as defined in claim 25 wherein:

the shortening and lengthening means shortens one period of the generated clock by shortening one period of the output clock from which the generated clock is generated upon determining that the reference clock transitioned before the transition point of the generated clock; and the shortening and lengthening means lengthens one period of the generated clock by lengthening one period of the output clock from which the generated clock is generated upon determining that the reference clock transitioned after the transition point of the generated clock.

27. A digital circuit as defined in claim 23 wherein:

the sampling means samples the reference clock at three successive periods of the count clock.

* * * * *